United States Patent
Nagayama et al.

(10) Patent No.: US 10,732,920 B2
(45) Date of Patent: Aug. 4, 2020

(54) COUPLED DISPLAY DEVICE

(71) Applicants: Sharp Kabushiki Kaisha, Sakai, Osaka (JP); Mitsubishi Electric Corporation, Chiyoda-ku, Tokyo (JP)

(72) Inventors: Kazumasa Nagayama, Sakai (JP); Nobuaki Aoki, Sakai (JP); Atsuhiko Nagamune, Chiyoda-ku (JP); Akitoshi Sudo, Chiyoda-ku (JP)

(73) Assignees: SHARP KABUSHIKI KAISHA, Sakai (JP); MITSUBISHI ELECTRIC COPORATION, Tokyo (JP)

( * ) Notice: Subject to any disclaimer, the term of this patent is extended or adjusted under 35 U.S.C. 154(b) by 0 days.

(21) Appl. No.: 16/365,796

(22) Filed: Mar. 27, 2019

(65) Prior Publication Data

US 2019/0303086 A1 Oct. 3, 2019

(30) Foreign Application Priority Data

Mar. 29, 2018 (JP) .................. 2018-064705

(51) Int. Cl.
*G06F 3/14* (2006.01)
*G02F 1/1333* (2006.01)
*H05K 5/00* (2006.01)

(52) U.S. Cl.
CPC ...... *G06F 3/1446* (2013.01); *G02F 1/133308* (2013.01); *H05K 5/0017* (2013.01); *H05K 5/0021* (2013.01)

(58) Field of Classification Search
CPC combination set(s) only.
See application file for complete search history.

(56) References Cited

U.S. PATENT DOCUMENTS

2019/0200470 A1* 6/2019 Woo .................... H05K 5/0226

FOREIGN PATENT DOCUMENTS

JP    2009-294574 A    12/2009

* cited by examiner

*Primary Examiner* — Deeprose Subedi
(74) *Attorney, Agent, or Firm* — Keating & Bennett, LLP

(57) ABSTRACT

A coupled display device includes display units, and a coupling component, retaining components. The display units are arranged adjacent to each other. The display units include fixers. The coupling component is disposed astride the display units to couple the display units together. The retaining components are fixed to the fixers to retain the display units and the coupling component. In the coupled display device, the fixers are point symmetric to each other with a point of symmetry at a center of a corresponding one of the display units.

13 Claims, 13 Drawing Sheets

COUPLED DISPLAY DEVICE

CROSS REFERENCE TO RELATED APPLICATION

This application claims priority from Japanese Patent Application No. 2018-064705 filed on Mar. 29, 2018. The entire contents of the priority application are incorporated herein by reference.

TECHNICAL FIELD

The technology described herein relates to a coupled display device.

BACKGROUND

An example of a known multiscreen display device is disclosed in Japanese Unexamined Patent Application Publication No. 2009-294574. The multiscreen display device disclosed in Japanese Unexamined Patent Application Publication No. 2009-294574 includes multiple display units each including a display unit that displays an image and a frame unit that surrounds the outer periphery of the display unit. The respective frame units of the display units are in close proximity to each other. Each of the frame units has its outer peripheral surface provided with depressions depressed from the outer peripheral surface toward a corresponding one of the display units and projections projecting from the outer peripheral surface toward a side opposite to the corresponding display unit. The depressions and projections of the display units, which are in close proximity to each other, fit together.

The display units of the multiscreen display device have fixing panels fixed to back surfaces thereof, respectively, and are coupled to each other by the fixing panels being attached to a substantially ladder-structured assembling mount. The display units are fixed to the assembling mount by fixing screws; however, places in the display units where the display units are fixed by the fixing screws are individually set according to the placement of the display units. That is, the display units are designed in dedication to the placement of the display units in the multiscreen display device and therefore incur high costs. Further, the cost of manufacturing the substantially ladder-structured assembling mount is high.

SUMMARY

The technology described herein was made in view of the above circumstances. An object is to reduce costs.

A coupled display device according to the technology described herein includes display units, a coupling component, an retaining components. The display units are arranged adjacent to each other. The display units include fixers. The coupling component is disposed astride the display units adjacent to each other to couple the display units together. The retaining components are fixed to the fixers to retain the display devices and the coupling component. The fixers are point symmetric to each other with a point of symmetry at a center of a corresponding one of the display units.

This causes images to be displayed on the multiple display devices adjacent to each other, respectively, and therefore enables a display that is larger in screen size than a display on a single display device. Since the multiple retaining components are fixed to the multiple fixers of each of the display devices adjacent to each other, the display devices adjacent to each other and the coupling component laid astride the display devices adjacent to each other are retained. For example, in a case of replacing a component of one of the display devices with a new one, it is only necessary to remove the retaining components to end the connection between the display devices coupled to each other through the coupling component. This leads to superior convenience. Moreover, since the multiple fixers are placed in a point symmetrical fashion whose point of symmetry is the center of a corresponding one of the display devices, the coupling component can be retained by fixing each of the retaining components to a corresponding one of the fixers of the display devices adjacent to each other, for example, even when one of the display devices adjacent to each other is reversed with respect to the other. This makes it possible to achieve commonality of components of the adjacent display devices in which at least the fixers are provided, so that a reduction in cost can be suitably achieved.

The technology described herein makes it possible to reduce costs.

DETAILED DESCRIPTION

First Embodiment

Figure 1:
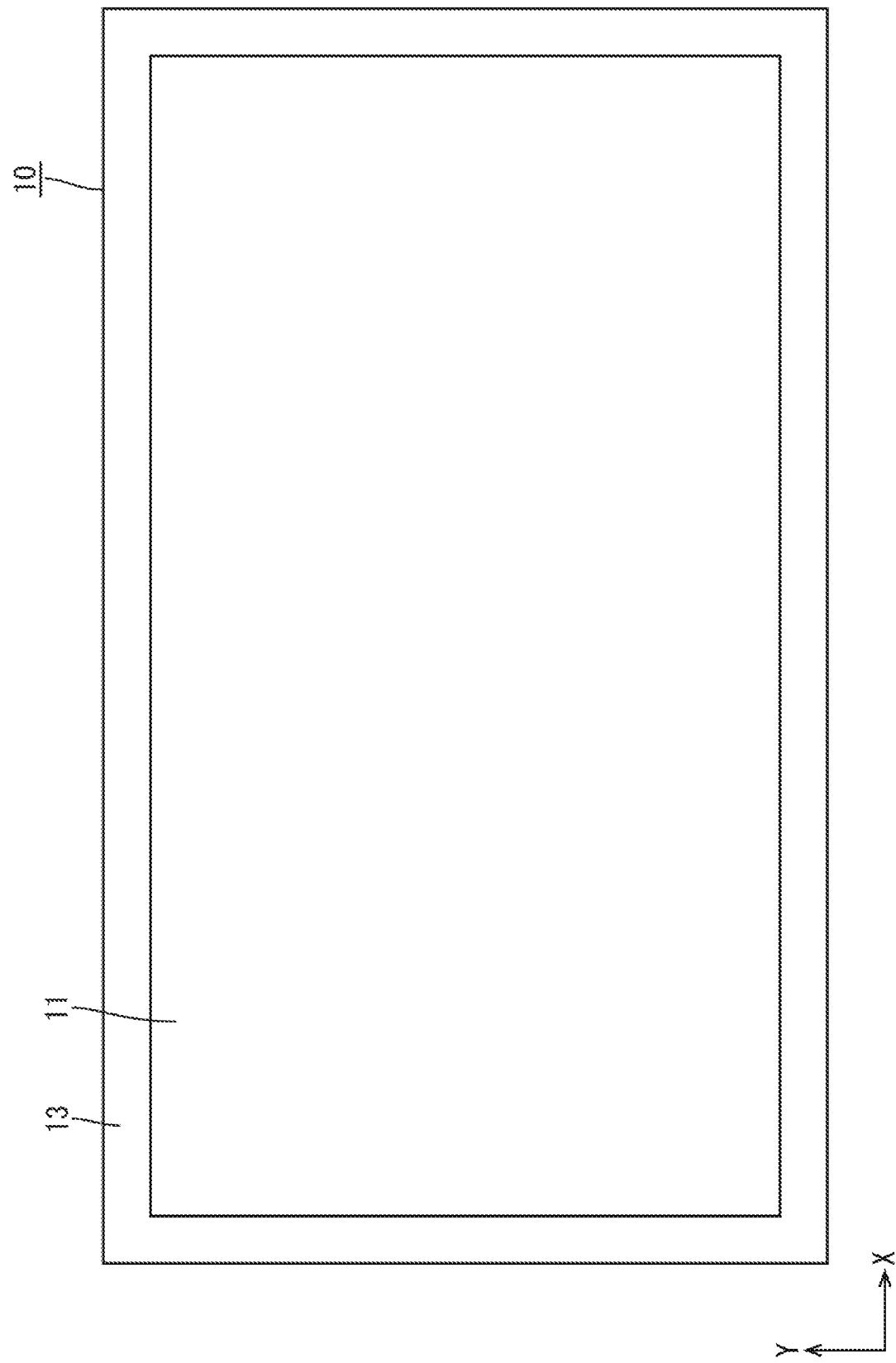
FIG. 1 is a plan view of a liquid crystal display device according to a first embodiment.

A first embodiment will be described with reference to FIGS. 1 to 12. A coupled liquid crystal display device 50 (a coupled display device) according to the first embodiment includes liquid crystal display units 10 (display units). The X axes, the Y axes, and the Z axes may be present in the drawings. The axes in each drawing correspond to the respective axes in other drawings to indicate the respective directions. An upper side and a lower side in FIGS. 2 and 8 to 10 correspond to a front side and a back side of the liquid crystal display unit 10, respectively.

Figure 2:
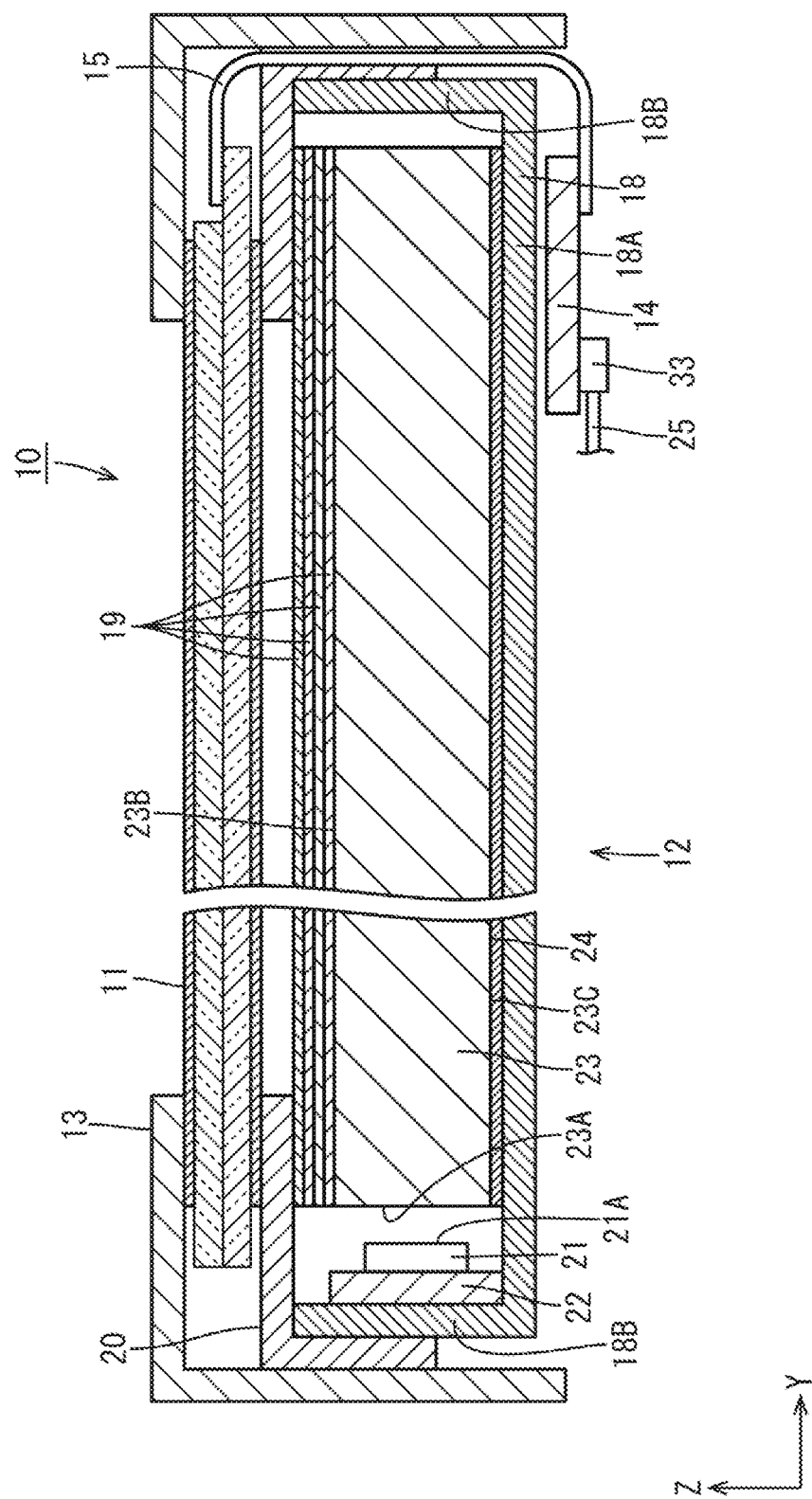
FIG. 2 is a cross-sectional view of the liquid crystal display device as taken along a short side direction.
Figure 3:
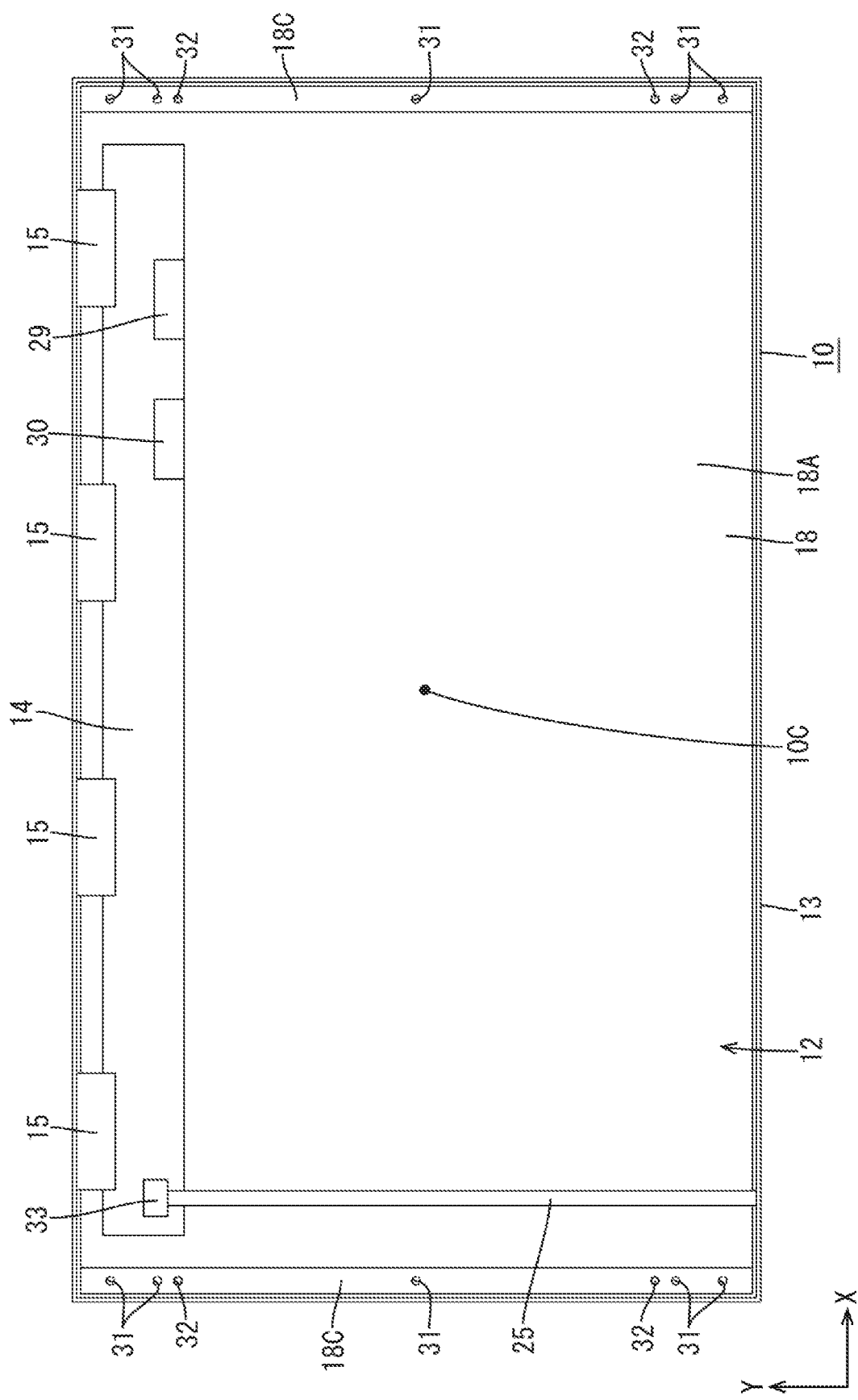
FIG. 3 is a back view of the liquid crystal display device.

First, a liquid crystal display device 10 is described. As shown in FIG. 1, the liquid crystal display device 10 has a horizontally long substantially square shape as a whole. As shown in FIGS. 2 and 3, the liquid crystal display device 10 includes a liquid crystal panel (display panel) 11 that displays an image and a backlight device (lighting device) 12 that supplies the liquid crystal panel 11 with light for display, and the liquid crystal panel 11 and the backlight device 12 are integrally held by a frame-shaped bezel 13 or the like. Furthermore, the liquid crystal display device 10 includes a control substrate 14 for controlling the driving of the liquid crystal panel 11 and the backlight device 12. As shown in FIG. 1, the liquid crystal display device 10 includes a display region, constituted by a center side portion of the liquid crystal panel 11, that displays an image and a non-display region (frame region), constituted by an outer peripheral side portion of the liquid crystal panel 11 and the whole area of the bezel 13, that has a frame shape that surrounds the display region.

As shown in FIG. 2, the liquid crystal panel 11 includes a pair of glass substrates bonded together with a predetermined gap therebetween and a liquid crystal layer (not illustrated), sealed in between the two glass substrates, that contains liquid crystal molecules constituting a substance whose optical properties vary in the presence of the application of a voltage. One (namely an array substrate or an active matrix substrate) of the glass substrates has an inner surface over which switching elements (e.g. TFTs) connected to source lines and gate lines that are orthogonal to each other and pixel electrodes connected to the switching elements and placed in square regions surrounded by the source lines and the gate lines are planarly arranged in a matrix and an alignment film and the like are further provided. The other (namely a counter substrate or a CF substrate) of the glass substrates has an inner surface over which a color filter having colored portions such as R (red) portions, G (green) portions, B (blue) portions, and the like planarly arranged in a matrix in a predetermined array is provided and a light-blocking layer (black matrix) placed between the colored portions to form a grid shape, a solid counter electrode opposed to the pixel electrodes, an alignment film, and the like are further provided. It should be noted that a polarizing plate is disposed on an outer surface of each of the two glass substrates. Further, the liquid crystal panel 11 has its long side direction corresponding to the X-axis direction, its short side direction corresponding to the Y-axis direction, and its thickness direction corresponding to a Z-axis direction.

As shown in FIG. 2, the liquid crystal panel 11 has an end to which a first end of each of multiple panel flexible substrates (flexible substrates) 15 is connected. The panel flexible substrates 15 are each mounted with a driver (not illustrated) by COF (chip on film), and this driver includes an LSI chip having a drive circuit inside. The control substrate 14 is connected to a second end of each of the panel flexible substrates 15. The control substrate 14 is placed behind the backlight device 12. Accordingly, the panel flexible substrates 15, which are connected to the liquid crystal panel 11 and the control substrate 14, are bent (curved) in a folded manner. The panel flexible substrates 15 each include a base material made of an insulative and flexible synthetic resin material (such as polyimide resin) and a large number of wiring patterns (not illustrated) on the base material. The control substrate 14 includes a base material that is higher in rigidity (more rigid) than those of the panel flexible substrates 15 and various types of electronic components mounted on a plate surface of the base material. The panel flexible substrates 15 described above are "panel connecting components" that are connected to both the liquid crystal panel 11 and the control substrate 14.

As shown in FIG. 2, the backlight device 12 includes a substantially box-shaped chassis (same component, housing) 18 having an opening facing toward the front side (i.e. toward the liquid crystal panel 11), an optical member (optical sheet) 19 disposed to cover the opening of the chassis 18, and a frame 20 that supports the optical member 19 from the front side. Furthermore, the chassis 18 houses an LED (light-emitting diode) 21 serving as alight source, an LED substrate (light source substrate) 22 on which the LED 21 is mounted, a light-guiding plate 23 that guides light from the LED 21 toward the optical member 19 (liquid crystal panel 11), and a reflecting sheet 24 disposed on a back side of the light-guiding plate 23. Moreover, the backlight device 12 is a one-side light entrance edge-lighting (side-lighting) backlight device in which the LED 21 is disposed at one end of the backlight device 12 in a short side direction (Y-axis direction) so that light from the LED 21 enters the light-guiding plate 23 through one side. The following describes each constituent component of the backlight device 12 in detail.

The chassis 18 is made of metal and, as shown in FIG. 2, includes a bottom part 18A having a horizontally long substantially square shape which is similar to that of the liquid crystal panel 11 and a side part 18B rising from the outer edge of each side of the bottom part 18A. The bottom part 18A has its long side direction corresponding to the X-axis direction (horizontal direction) and its short side direction corresponding to the Y-axis direction (vertical direction). As shown in FIG. 3, the bottom part 18A has a pair of shot side ends that extend along the Y-axis direction and project toward the back side over predetermined widths to form a pair of stepped sections (coupling sections, attaching sections) 18C. The stepped sections 18C are provided in such a manner as to extend over substantially the entire length of the base part 18A along the short side direction. The stepped sections 18C are designed so that the aftermentioned coupling component 51 is attached to the stepped sections 18C. Further, the frame 20 and the bezel 13 may be fixed to each side part 18B.

As shown in FIG. 2, by covering the opening of the chassis 18 and being placed between the liquid crystal panel 11 and the light-guiding plate 23, the optical member 19 transmits emitted light from the light-guiding plate 23 and, while imparting a predetermined optical effect to the transmitted light, causing the transmitted light to exit toward the liquid crystal panel 11. The optical member 19 includes multiple (in the first embodiment, four) optical members. Specific examples of types of the optical members include a diffusion sheet, a lens sheet (prism sheet), a reflective polarizing sheet, a lens diffuser, and the like from which a selection can be made as appropriate for use. The frame 20 has a horizontally long frame shape, substantially entirely holds and supports the outer peripheral edges of the optical member 19 and the light-guiding plate 23 from the front side, and substantially entirely receives and supports the outer peripheral edges of the liquid crystal panel 11 from the back side.

As shown in FIG. 2, the LED 21 includes a base member that is firmly fixed to the LED substrate 22, an LED chip on the base member, and a sealant sealing the LED chip. The LED 21 emits white light as a whole by having its LED chip designed to monochromatically emit blue light and having its sealant dispersedly blended with phosphors (such as a yellow phosphor, a green phosphor, and a red phosphor). The LED 21 has its light-emitting surface 21A opposed to a surface thereof mounted on the LED substrate 22, which will be described next. As such, the LED 21 is a so-called top-emitting light-emitting diode.

As shown in FIG. 2, the LED substrate 22 has a plate shape that extends along the X-axis direction, and is accommodated in the chassis 18 in such a position that a plate surface of the LED substrate 22 runs parallel to the X-axis direction and the Z-axis direction. The LED substrate 22 is mounted in such a manner that a mounting surface of the LED substrate 22 on which more than one of these LEDs 21 are mounted faces an end face (light entrance end face 23A) of the light-guiding plate 23, which will be described next, and a plate surface of the LED substrate 22 opposite to the mounting surface on which the LEDs 21 are mounted makes contact with a side part 18B of the chassis 18. The mounting surface of the LED substrate 22 on which the LEDs 21 are mounted is constituted by a metal film (such as copper foil), and has formed thereon a wiring pattern (not illustrated) that is connected to a terminal or the like of each LED 21. The multiple LEDs 21 are placed at intervals along the X-axis direction on the mounting surface of the LED substrate 22. The LED substrate 22 is provided with a feeding connector (not illustrated) to which a backlight flexible flat cable (light source feed component) 25 has its first end connected. The backlight flexible flat cable 25 has its second end drawn out of the chassis 18 and connected to the control substrate 14 (see FIG. 3). The backlight flexible flat cable 25 includes multiple wiring parts running parallel to each other and insulative and flexible films, made of synthetic resin, between which the wiring parts are sandwiched.

The light-guiding plate 23 is made of a substantially transparent synthetic resin material (e.g. acrylic resin such as PMMA, polycarbonate, or the like), and has a sufficiently higher refractive index than air. As shown in FIG. 2, the light-guiding plate 23 has a horizontally long plate shape which is similar to that of the liquid crystal panel 11 or the like, is accommodated in the chassis 18 in such a manner as to be surrounded by the chassis 18 on every side, and is located directly below the liquid crystal panel 11 and the optical member 19. The light-guiding plate 23 has outer peripheral end faces including one long-side end face (left in FIG. 2) that serves as a light entrance end face (light source opposed end face) 23A, opposed to the LEDs 21, upon which light from the LEDs 21 falls. The light-guiding plate 23 has a pair of front and back plate surfaces. That one of these plate surfaces which faces toward the front side (i.e. toward the liquid crystal panel 11) serves as a light exit plate surface 23B that causes light to exit toward the liquid crystal panel 11, and that one of these plate surfaces which faces toward the back side serves as a light exit opposite plate surface 23C opposed to the light exit plate surface 23B. With such a configuration, the light-guiding plate 23 has a function of introducing, through the light entrance end face 23A, light emitted along the Y-axis direction from the LEDs 21 and, after having propagated the light inside, raising the light along the Z-axis direction and causing the light to exit through the light exit surface 23B toward the optical member 19 (i.e. toward the front side or light exit side).

As shown in FIG. 2, the reflecting sheet 24 is disposed to cover the light exit opposite plate surface 23C of the light-guiding plate 23. The reflecting sheet 24 is high in light reflectivity and can efficiently raise, toward the front side (i.e. toward the light exist plate surface 23B), light leaked through the light exit opposite plate surface 23C of the light-guiding plate 23.

Figure 4:
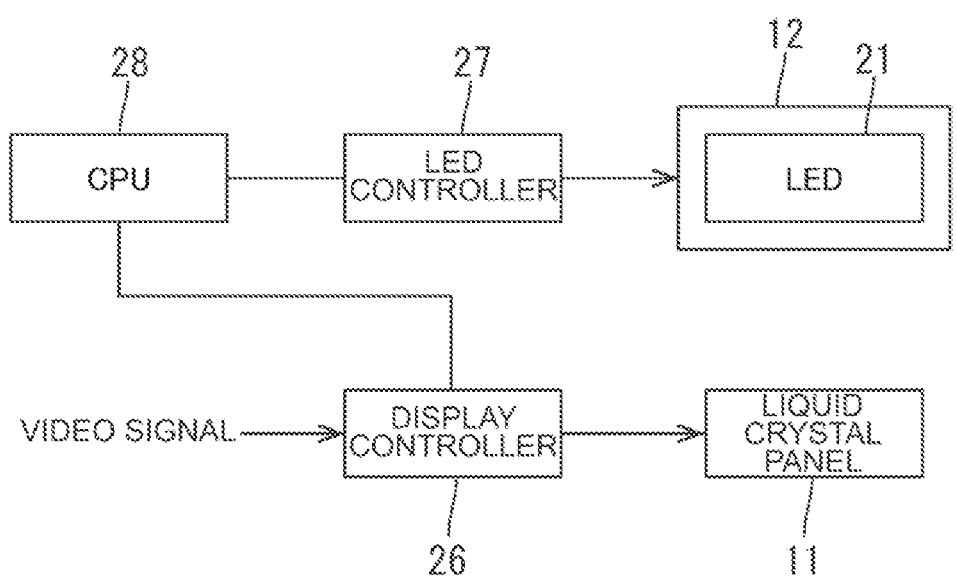
FIG. 4 is a block diagram showing an electrical configuration of the liquid crystal display device.

As shown in FIG. 4, the liquid crystal display device 10 according to the first embodiment includes at least a display controller (display panel controller) 26 for controlling the driving of the liquid crystal panel 11 and an LED controller (light source controller) 27 for controlling the driving of the LEDs 21 of the backlight device 12. The display controller 26 includes a video signal processing circuit that process a video signal and a pixel driver that drives each pixel in accordance with an output signal from the video signal processing circuit, and is provided on the control substrate 14. The LED controller 27 includes an LED driver that drives the LEDs 21, and is provided on the control substrate 14. The control substrate 14 is provided with a CPU 28 that controls how the display controller 26 and the LED controller 27 operate.

As shown in FIGS. 2 and 3, the control substrate 14 is provided with a panel input connector 29 to which a connector of a flexible substrate having its first end connected to an external panel signal supply source and its second end provided with the connector is connected (neither the flexible substrate nor the external panel signal supply source illustrated) and to which a video signal is supplied, a backlight input connector 30 to which a connector of a flexible substrate having its first end connected to an external backlight signal supply source and its second end provided with the connector is connected (neither the flexible substrate nor the external backlight signal supply source illustrated) and to which a backlight signal is supplied, and a backlight output connector 33 to which the second end of the backlight flexible flat cable 25, which has its first end connected to the feeding connector of the LED substrate 22, is connected. The external panel signal supply source supplies an original video signal to the panel input connector 29 of the control substrate 14. The control substrate 14 processes the original video signal thus supplied. The liquid crystal display panel 11 displays an image in accordance with the video signal thus processed. The external backlight signal supply source supplies an original backlight signal to the backlight input connector 30 of the control substrate 14. The control substrate 14 processes the original backlight signal thus supplied. The LEDs 21 are driven in accordance with an LED drive signal processed.

Figure 5:
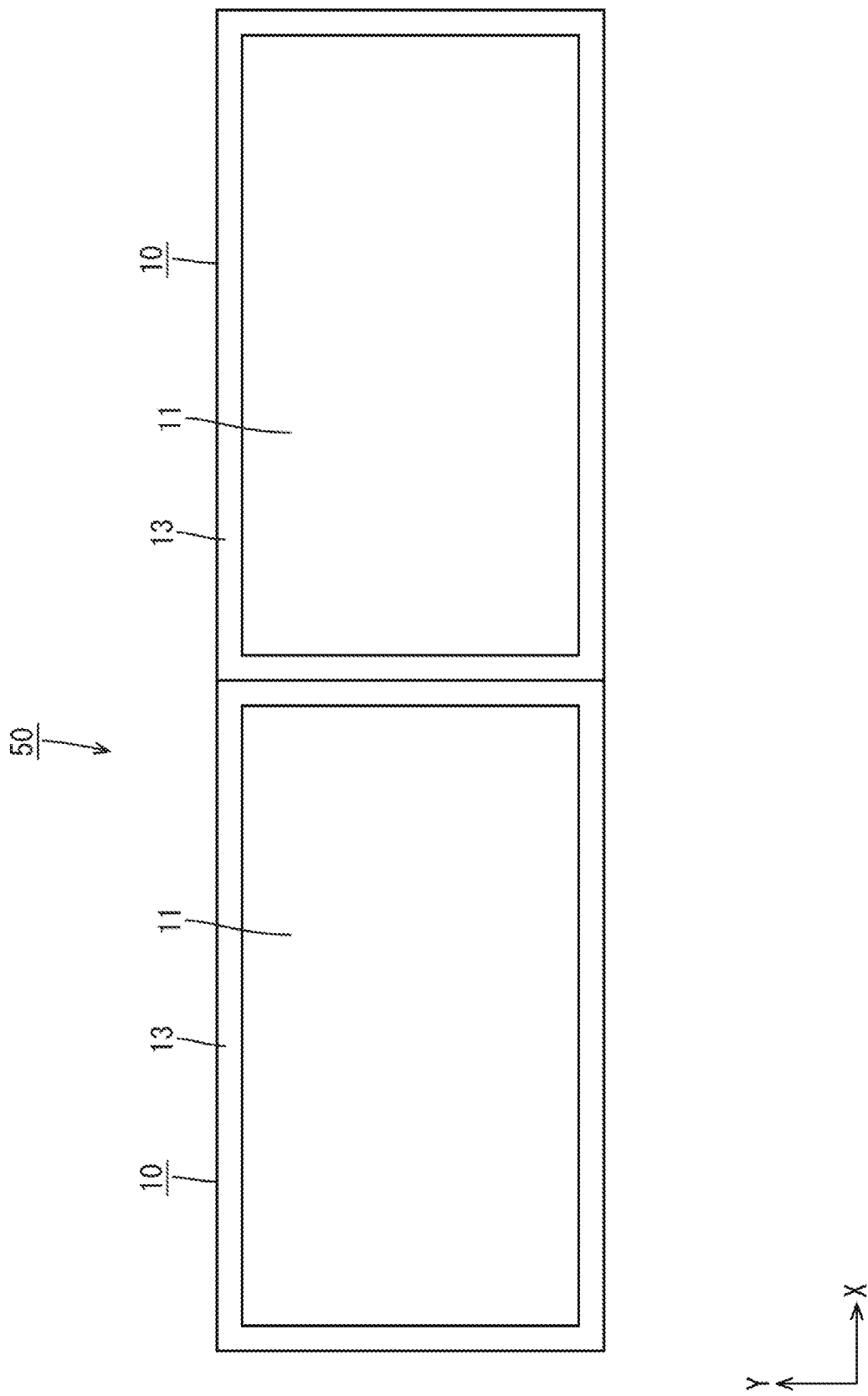
FIG. 5 is a plan view of a coupled liquid crystal display device.
Figure 6:
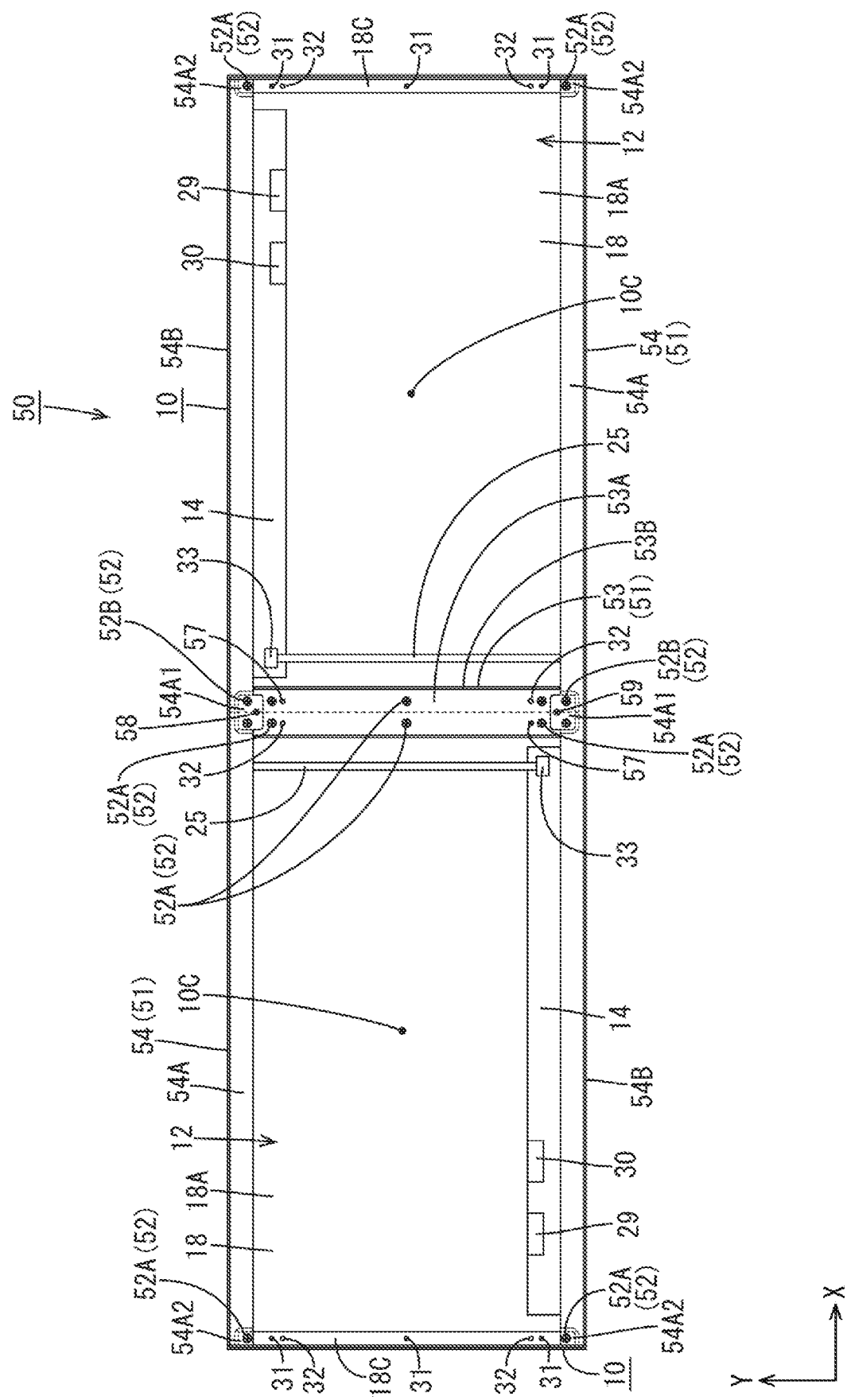
FIG. 6 is a back view of the coupled liquid crystal display device.

Next, the coupled liquid crystal display device 50 is described. As shown in FIGS. 5 and 6, the coupled liquid crystal display device 50 includes two liquid crystal display units 10 coupled to each other after having been arranged adjacent to each other in the X-axis direction (an arrangement direction). This allows a horizontally long image to be suitably displayed by the two liquid crystal display units 10. Specific suitable examples of uses of the coupled liquid crystal display device 50 include digital signage that is installed around the doors of a train, and suitable examples of images to be displayed include train maps and advertisements.

Moreover, as shown in FIGS. 5 and 6, the coupled liquid crystal display device 50 according to the first embodiment is configured such that the two liquid crystal display device 10 arranged along the X-axis direction are placed in positions that upside-down reversals of each other in the Y-axis direction (a direction perpendicular to the arrangement direction). Specifically, one of the two liquid crystal display units 10 arranged along the X-axis direction is placed in a first position in which the panel flexible substrates 15 face toward an upper side of each of FIGS. 5 and 6 in the Y-axis direction. On the other hand, the other of the two liquid crystal display units 10 arranged along the X-axis direction is placed in a second position in which the panel flexible substrates 15 face toward a lower side of each of FIGS. 5 and 6 in the Y-axis direction and that is an upside-down reversal of the first position in the Y-axis direction. The first embodiment assumes that the liquid crystal display device 10 shown on the left in FIG. 5 (and shown on the right in FIG. 6) is in the first position and the liquid crystal display device 10 shown on the right in FIG. 5 (and shown on the left in FIG. 6) is in the second position. Meanwhile, the display controller 26 controls the driving of the liquid crystal panel 11 so that in both the first and second positions, images displayed on the liquid crystal panel 11 are identical in orientation to each other in the Y-axis direction. This makes it possible to, even when the liquid crystal display units 10 adjacent to each other in the X-axis direction are coupled to each other in positions that are reversals of each other, cause the respective liquid crystal panels 11 of the liquid crystal display units 10 to display appropriate images, respectively. As shown in FIG. 6, the total of four stepped sections 18C of the liquid crystal display units 10 adjacent to each other in positions that are reversals of each other as described above are disposed so that two of them are dispersedly placed at both ends, respectively, of the coupled liquid crystal display device 50 in the X-axis direction and the other two of them are adjacent to each other in a central part of the coupled liquid crystal display device 50 in the X-axis direction.

In a specific description of display driving, the display controller 26 enables a first display signal for display in the first position shown in FIG. 6 and a second display signal for display in the second position shown in FIG. 6 to be selectively outputted in accordance with a video signal that is supplied from the external panel signal supply source. More specifically, a video signal that is outputted from the external panel signal supply source includes either a first display trigger signal or a second display trigger signal. In a case where the first display trigger signal is included, the display controller 26 outputs the first display signal, and in a case where the second display trigger signal is included, the display controller 26 outputs the second display signal. The first display trigger signal and the second display trigger signal are supplied to an identical terminal of the panel input connector 29. One of the first and second trigger signals is a high-voltage signal, and the other of the first and second trigger signals is a low-voltage signal. Whether the external panel signal supply source outputs the first display trigger signal or the second display trigger signal may be controlled by adjusting the settings of the external panel signal supply source according to the position of the liquid crystal display device 10 installed. Accordingly, regarding the liquid crystal display device 10 shown in the first position on the right in FIG. 6, the inclusion of the first display trigger signal in the video signal that is outputted from the external panel signal supply source causes the first display signal to be outputted from the display controller 26 and supplied to the liquid crystal panel 11 via the panel flexible substrates 15. As a result, the first display signal causes an image appropriately oriented in the Y-axis direction to be displayed on the liquid crystal panel 11 of the liquid crystal display device 10 placed in the first position. On the other hand, regarding the liquid crystal display device 10 shown in the second position on the left in FIG. 6, the inclusion of the second display trigger signal in the video signal that is outputted from the external panel signal supply source causes the second display signal to be outputted from the display controller 26 and supplied to the liquid crystal panel 11 via the panel flexible substrates 15. As a result, the second display signal causes an image appropriately oriented in the Y-axis direction to be displayed on the liquid crystal panel 11 of the liquid crystal display device 10 placed in the second position. By thus adjusting, according to the position of the liquid crystal display device 10, whether the video signal that is outputted from the external panel signal supply source includes the first display trigger signal or the second display trigger signal, the orientation in the Y-axis direction of an image that is displayed on the liquid crystal panel 11 can be normalized.

The following describes in detail a coupling structure through which the liquid crystal display units 10 adjacent to each other in the coupled liquid crystal display device 50 are coupled to each other. This coupling structure includes at least a coupling component 51, laid astride the liquid crystal display units 10 adjacent to each other, that couples together the liquid crystal display units 10 adjacent to each other, a retaining component 52 that retains the liquid crystal display units 10 adjacent to each other and the coupling part 51, and a fixer 31, provided in each of the liquid crystal display units 10, that fixes the retaining component 52. Among these, the retaining component 52 is for example a screw having a shank with a threaded outer circumferential surface.

Figure 7:
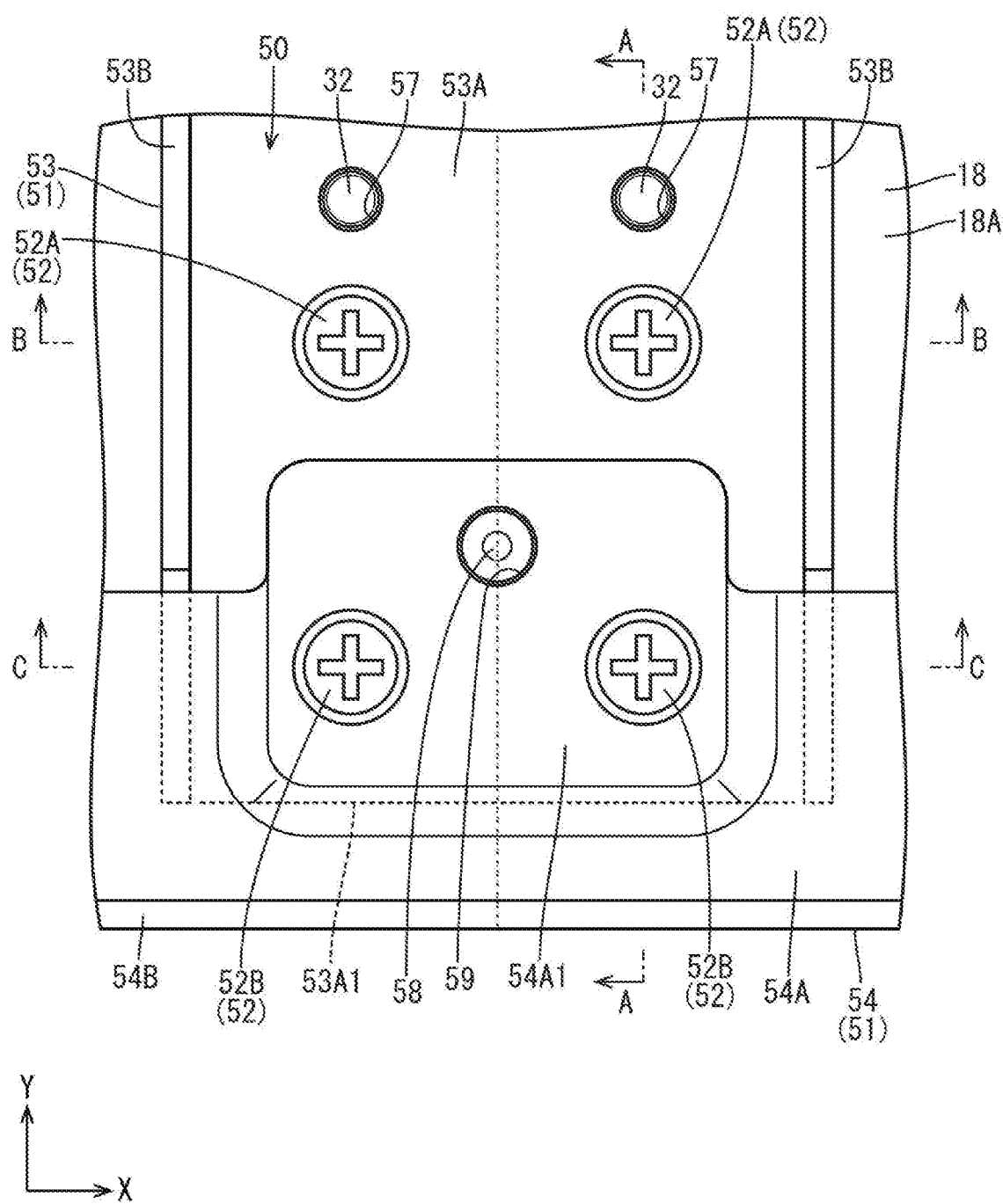
FIG. 7 is a back view of a central part of the coupled liquid crystal display device in a long side direction.
Figure 8:
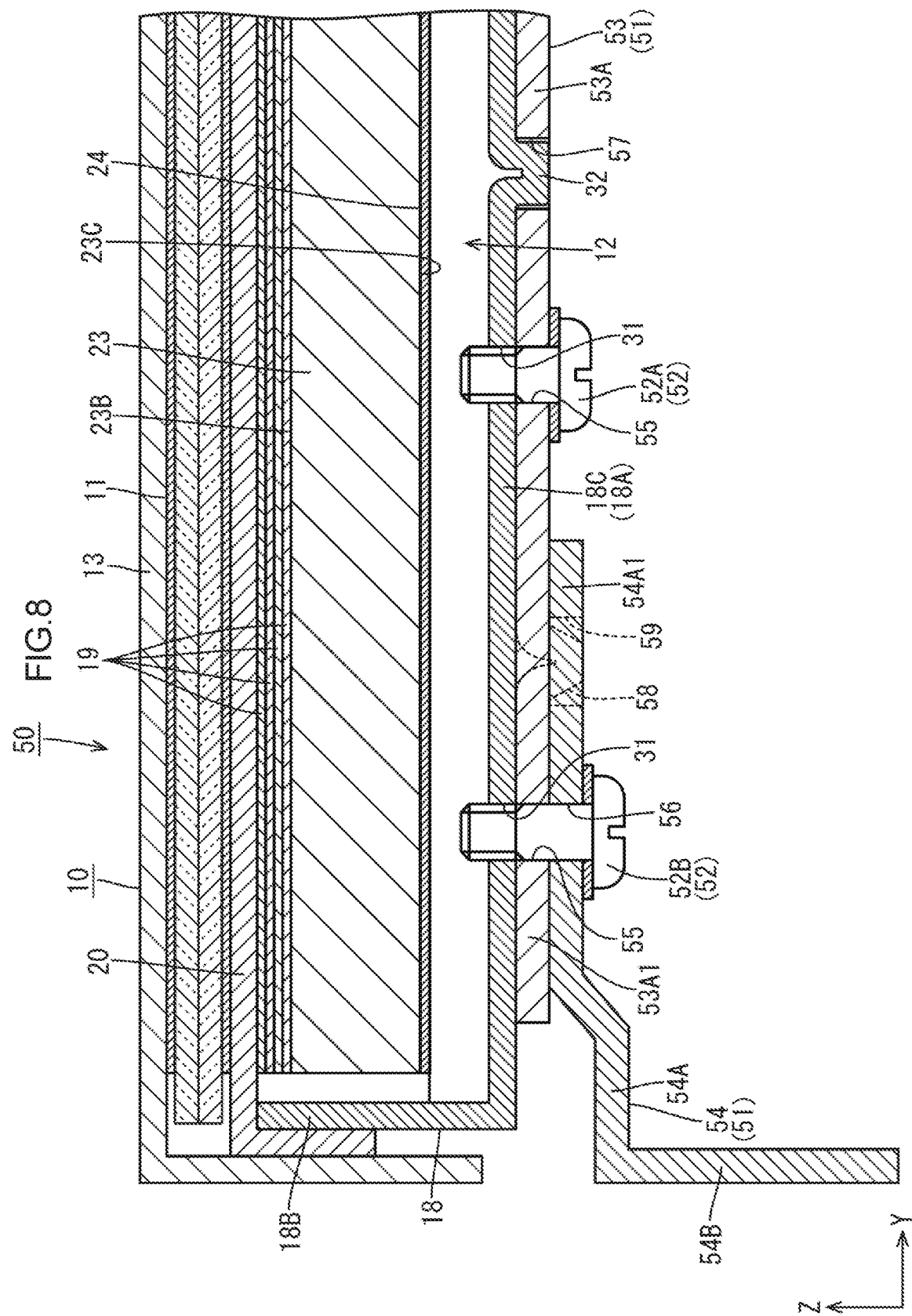
FIG. 8 is a cross-sectional view taken along line A-A in FIG. 7.

The following describes parts of the coupling structure that belong to the liquid crystal display units 10. As shown in FIGS. 7 and 8, each of the stepped sections 18C of the bottom part 18A of the chassis 18 of each of the liquid crystal display units 10 includes, in addition to the fixer 31 described above, a liquid crystal display unit side positioner (display unit side positioner) 32 for positioning the coupling component 51 with respect to the liquid crystal display device 10. That is, the fixer 31 and the liquid crystal display unit side positioner 32 are provided in the chassis 18, which is the same one of the constituent components of the liquid crystal display device 10. The fixer 31 takes the shape of a hole bored through the stepped section 18C in the thickness direction (Z-axis direction) and has an inner circumferential surface onto which the retaining component 52 can be screwed. As shown in FIG. 6, more than one of these fixers 31 are placed at intervals along a direction of extension (Y-axis direction, the direction perpendicular to the arrangement direction) of the stepped section 18C. Specifically, a total of five fixers 31 are placed in a symmetrical fashion (point symmetrical fashion, line symmetrical fashion) with respect to a middle position on the stepped section 18C in the direction of extension so that one of them is provided in the middle position on the stepped section 18C in the direction of extension and two of them are provided near either end on the stepped section 18C in the direction of extension. As many of these retaining components 52 as these fixers 31 are provided, and these retaining components 52 are fixed to these fixers 31, respectively. As shown in FIGS. 7 and 8, the liquid crystal display unit side positioner 32 is provided in such a manner that the stepped section 18C is partially projected toward the back side along the Z-axis direction. As shown in FIG. 6, more than one of these liquid crystal display unit side positioners 32 are placed at intervals along the direction of extension of the stepped section 18C. Specifically, a total of two liquid crystal display unit side positioners 32 are placed in a symmetrical fashion (point symmetrical fashion, line symmetrical fashion) with respect to the middle position on the stepped section 18C in the direction of extension so that each of them is provided in a location closer to the middle of the stepped section 18C than the two fixers 31 arranged at either end of the stepped section 18C in the direction of extension.

Moreover, as shown in FIG. 3, multiple fixers 31 and multiple liquid crystal display unit side positioners 32 are placed in a point symmetrical fashion whose point of symmetry is a center 10C of the liquid crystal display device 10. In this way, as shown in FIG. 6, while the two liquid crystal display units 10 adjacent to each other in the coupled liquid crystal display device 50 are placed in positions (first and second positions) that are upside-down reversals of each other, the placement of multiple fixers 31 and multiple liquid crystal display unit side positioners 32 with respect to the center 10C in each of the liquid crystal display units 10 is identical to the placement of multiple fixers 31 and multiple liquid crystal display unit side positioners 32 with respect to the center 10C in the other liquid crystal display device 10. Accordingly, even when the liquid crystal display units 10 adjacent to each other in the coupled liquid crystal display device 50 are in positions that are reversals of each other, the coupling component 51 can be retained by fixing each of the retaining components 52 to a corresponding one of the fixers 31 of the liquid crystal display units 10 adjacent to each other. This makes it possible to achieve commonality of the chassis 18, which are components of the adjacent liquid crystal display units 10 in which at least the fixers 31 are provided, so that a reduction in cost can be suitably achieved. Moreover, since the liquid crystal display units 10 adjacent to each other in the coupled liquid crystal display device 50 are identical to each other, the cost of manufacturing the liquid crystal display units 10 can be further lowered.

As shown in FIG. 6, the coupling component 51 includes a first coupling component 53 that extends along a short side direction (Y-axis direction) of the coupled liquid crystal display device 50 and a pair of second coupling components 54 that extend along a long side direction (X-axis direction) of the coupled liquid crystal display device 50. The first coupling component 53 is disposed to overlap a central part of the coupled liquid crystal display device 50 in the X-axis direction. More specifically, the first coupling component 53 is laid astride two stepped sections 18C located adjacent to each other in the central part of the coupled liquid crystal display device 50 in the X-axis direction and is disposed to cover the two stepped sections 18C from the back side over substantially the entire length. The first coupling component 53 includes a basal part 53A that faces and makes contact with the two adjacent stepped sections 18C and a pair of side plate parts 53B that project from both ends, respectively, of the basal part 53A in a width direction (X-axis direction) toward a side opposite (outer side) to the stepped sections 18C along the Z-axis direction. A middle position on the basal part 53A in the width direction substantially corresponds to a boundary position between the liquid crystal display units 10 adjacent to each other.

Figure 10:
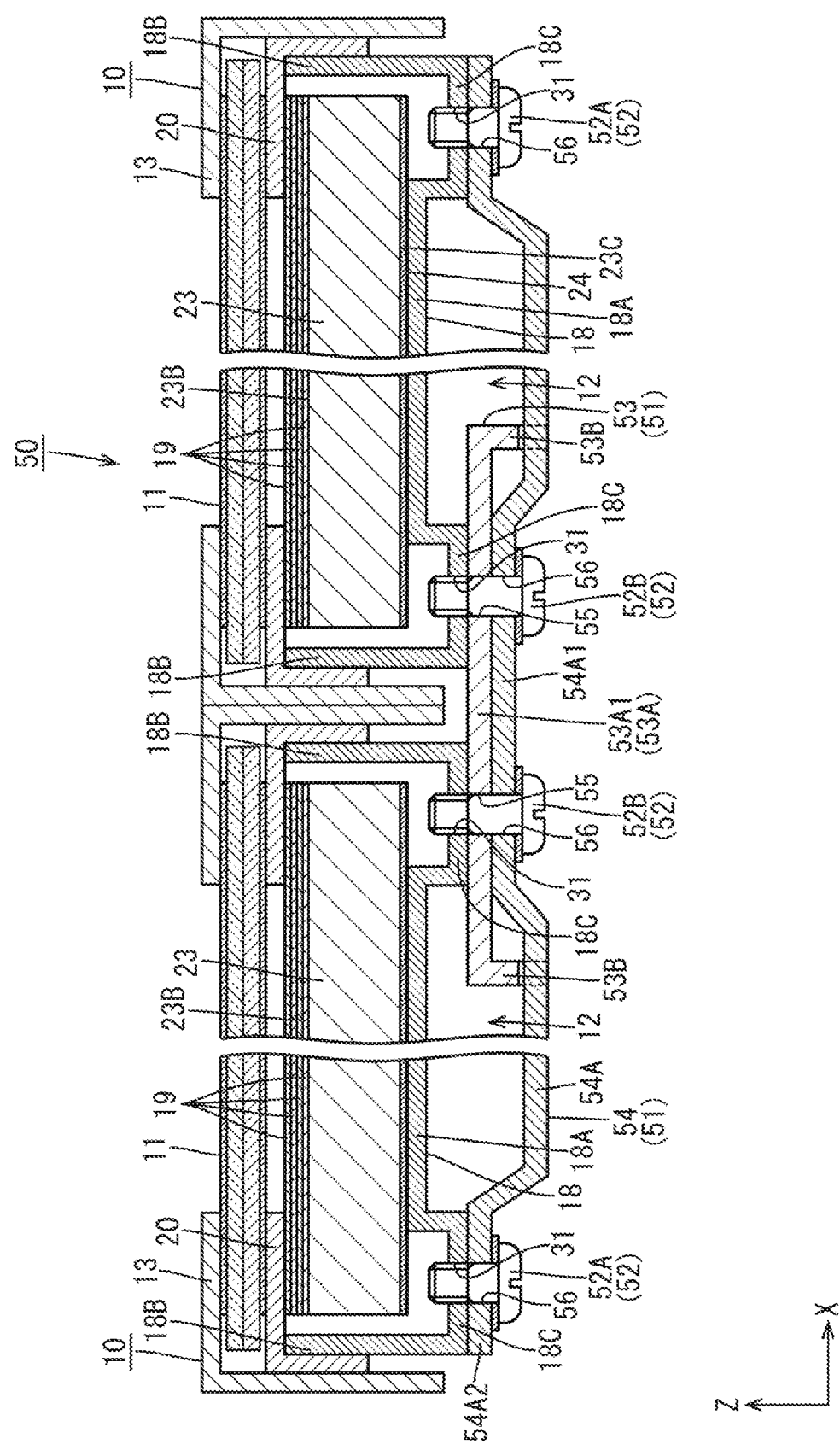
FIG. 10 is a cross-sectional view taken along line C-C in FIG. 7.

As shown in FIG. 6, the pair of second coupling components 54 are disposed to overlap both ends, respectively, of the coupled liquid crystal display device 50 in the Y-axis direction. More specifically, as shown in FIG. 10, each of the second coupling components 54 is disposed to overlap the back sides of the two adjacent stepped sections 18C and the back sides of the bottom parts 18A, provided with those stepped sections 18C, of the chassis 18 over the entire length along a long side direction of the second coupling component 54. As shown in FIG. 8, each of the second coupling components 54 includes a basal part 54A that faces the bottom parts 18A of the chassis 18 of the liquid crystal display units 10 adjacent to each other and a side plate part 54B that projects from an outer end of the basal part 54A in a width direction (Y-axis direction) toward a side opposite (outer side) to the chassis 18 along the Z-axis direction. The pair of second coupling components 54 are identical components. As shown in FIG. 10, the basal part 54A of each of the second coupling components 54 is disposed so that a central part of the second coupling component 54 in a length direction (X-axis direction) overlaps an end of the basal part 53A of the first coupling component 53 in a length direction (Y-axis direction), and a part of the overlap section serves as a first overhanging section (overlap section) 54A1 that overhangs in the shape of a step with respect to many other parts. The first overhanging section 54A1 is in contact with an overlap section 53A1 of the first coupling component 53 with the first overhanging section 54A1. Both ends of the basal part 54A of each of the second coupling components 54 in the length direction serve as a pair of second overhanging sections (non-overlap sections) 54A2 that overhang toward the front side in the shape of steps with respect to many other parts. The pairs of second overhanging sections 54A2 are non-overlap sections that do not overlap the first coupling component 53, and are in contact with both ends, respectively, of the coupled liquid crystal display device 50 in the length direction (end of each of the liquid crystal display units 10 opposite to the first coupling component 53 in the X-axis direction). Accordingly, these overhanging sections 54A1 and 54A2 cause the basal parts 54A of the second coupling components 54 to be mostly placed on the back side of each of the liquid crystal display units 10 at intervals in the Z-axis direction. This makes it hard for the second coupling components 54 from interfering with components such as substrates of each of the liquid crystal display units 10.

Figure 9:
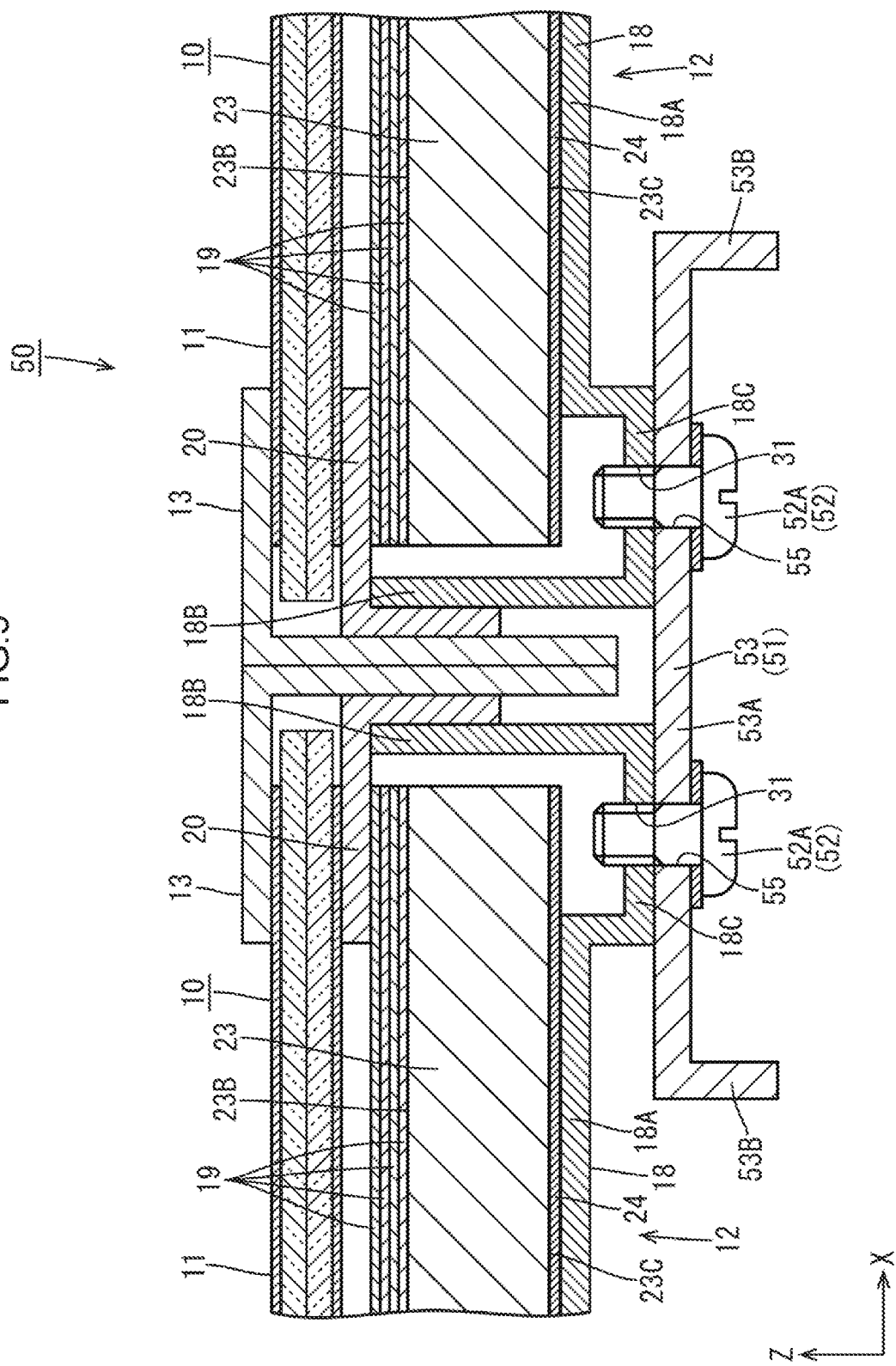
FIG. 9 is a cross-sectional view taken along line B-B in FIG. 7.

As shown in FIGS. 8 to 10, the respective basal parts 53A and 54A of the coupling components 53 and 54 are provided with fixer communication holes 55 and 56 through which the retaining components 52 are fixed to the fixers 31, respectively. As many of these fixer communication holes 55 and 56 as the fixers 31 are provided in locations overlapped with the fixers 31 of each of the liquid crystal display units 10 in a plan view in a state where the coupling components 53 and 54 are positioned with respect to each of the liquid crystal display units 10 in the X-axis and Y-axis directions. Specifically, as shown in FIGS. 6, 7, and 9, the basal part 53A of the first coupling component 53 has ten first fixer communication holes 55 bored therethrough in locations overlapped in a plan view with ten fixers 31 provided in two stepped sections 18C located adjacent to each other, respectively. The basal part 53A of the first coupling component 53 has six first fixer communication holes 55 disposed in a center side portion thereof excluding both ends thereof in the length direction (Y-axis direction), i.e. in a non-overlap section thereof that does not overlap the second coupling components 54. The six retaining components 52 that are fixed to the corresponding fixers 31 through these six first fixer communication holes 55 serve to retain the first coupling component 53 alone against the liquid crystal display units 10, and are referred to as "non-overlap retaining components 52A" for the sake of distinction.

As shown in FIGS. 6, 7, and 10, the basal part 53A of the first coupling component 53 have four fixer communication holes 55 disposed in both ends thereof in the length direction, i.e. in overlap sections 53A1 thereof with the second coupling components 54. Meanwhile, the basal parts 54A of the second coupling components 54 have four second fixer communication holes 56 disposed in central parts thereof in the length direction, i.e. in first overhanging sections 54A1 thereof that overlap the first coupling component 53. These four second fixer communication holes 56 are overlappingly disposed to communicate with four first fixer communication holes 55 bored through the first coupling component 53, and the four retaining components 52 that are fixed to the corresponding fixers 31 through these four fixer communication holes 55 and 56 serve to retain the first coupling component 53 and the second coupling components 54 together against the liquid crystal display units 10, and are referred to as "overlap retaining components 52B" for the sake of distinction. Furthermore, the basal parts 54A of the second coupling components 54 have four second fixer communication holes 56 disposed at both ends thereof in the length direction, i.e. pairs of second overhanging sections 54A2 thereof that do not overlap the first coupling component 53. The four retaining components 52 that are fixed to the corresponding fixers 31 through these four second fixer communication holes 56 serve to retain the second coupling components 54 alone against the liquid crystal display units 10, and are referred to as "non-overlap retaining components 52A" for the sake of distinction. Further, the respective side plate parts 53B and 54B of the coupling components 53 and 54 are available for use, for example, in fixation to a physical object (not illustrated) on which the coupled liquid crystal display device 50 is installed.

As shown in FIGS. 7 and 8, the basal part 53A of the first coupling component 53 has coupling component side positioners 57, provided in locations overlapped with the liquid crystal display unit side positioners 32, that are fitted onto the liquid crystal display unit side positioners 32 by means of depressions and projections. The coupling component side positioners 57 take the shape of holes bored through the basal part 53A in the thickness direction (Z-axis direction), and the liquid crystal display unit side positioners 32 take the shape of protrusions that are fitted into the holes. A total of four of these coupling component side positioners 57 are placed at intervals in the X-axis and Y-axis directions so as to overlap the liquid crystal display unit side positioners 32 of the stepped sections 18C. In assembling, the liquid crystal display unit side positioners 32 and the coupling component side positioners 57 are fitted together by means of depressions and projections so that the first coupling component 53 can be positioned with respect to each of liquid crystal display units 10 in the X-axis and Y-axis directions (i.e. directions along display surfaces of the liquid crystal display units 10).

As shown in FIGS. 7 and 8, each of the overlap sections 53A1 of the basal part 53A of the first coupling component 53 with a corresponding one of the second coupling components 54 is provided with a first coupling component side positioner 58. The first coupling component side positioner 58 is provided in such a manner that the basal part 53A is partially projected toward the back side (i.e. toward the overlapping second coupling component 54) along the Z-axis direction. Meanwhile, each of the first overhanging sections 54A1 of the basal parts 54A of the second coupling components 54 is provided with a second coupling component side positioner 59 into which the first coupling component side positioner 58 is fitted by means of a depression and a projection. The second coupling component side positioner 59 takes the shape of a hole bored through the first overhanging section 54A1 in the thickness direction, and the first coupling component side positioner 58 takes the shape of a protrusion that is fitted into the hole. The first coupling component side positioner 58 and the second coupling component side positioner 59 are placed in a location that, when seen in a plan view, that is equally distant from four retaining components 52 (two non-overlap retaining components 52A and two overlap retaining components 52B) that retain an end of the first coupling component 53 in the length direction against the liquid crystal display units 10. In assembling, the first coupling component side positioner 58 and the second coupling component side positioner 59 are fitted together by means of a depression and a projection so that the second coupling components 54 can be positioned with respect to the first coupling component 53 in the X-axis and Y-axis directions.

Figure 11:
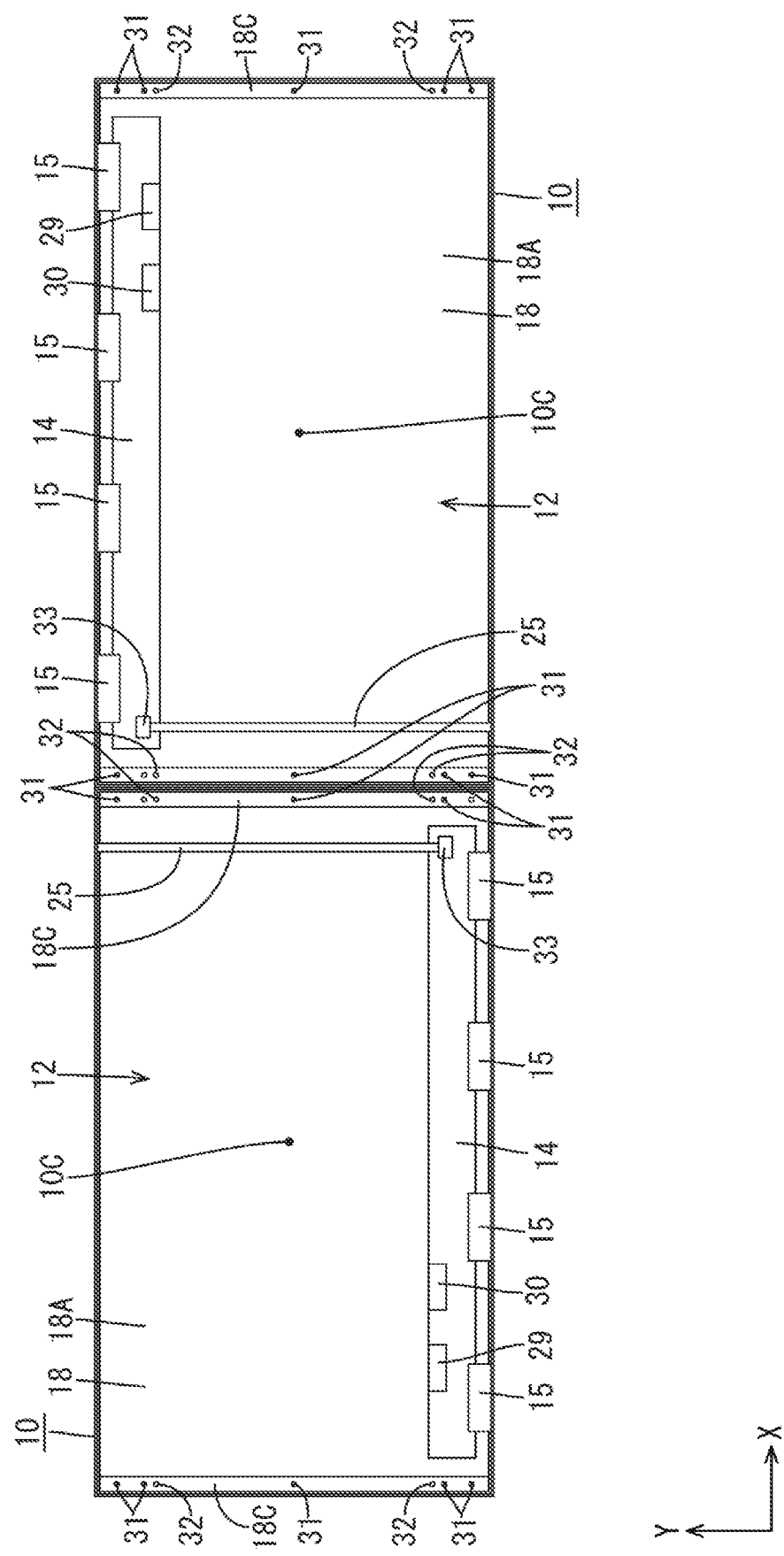
FIG. 11 is a back view of adjacent liquid crystal display units to which a first coupling component and a second coupling component are to be attached.
Figure 12:
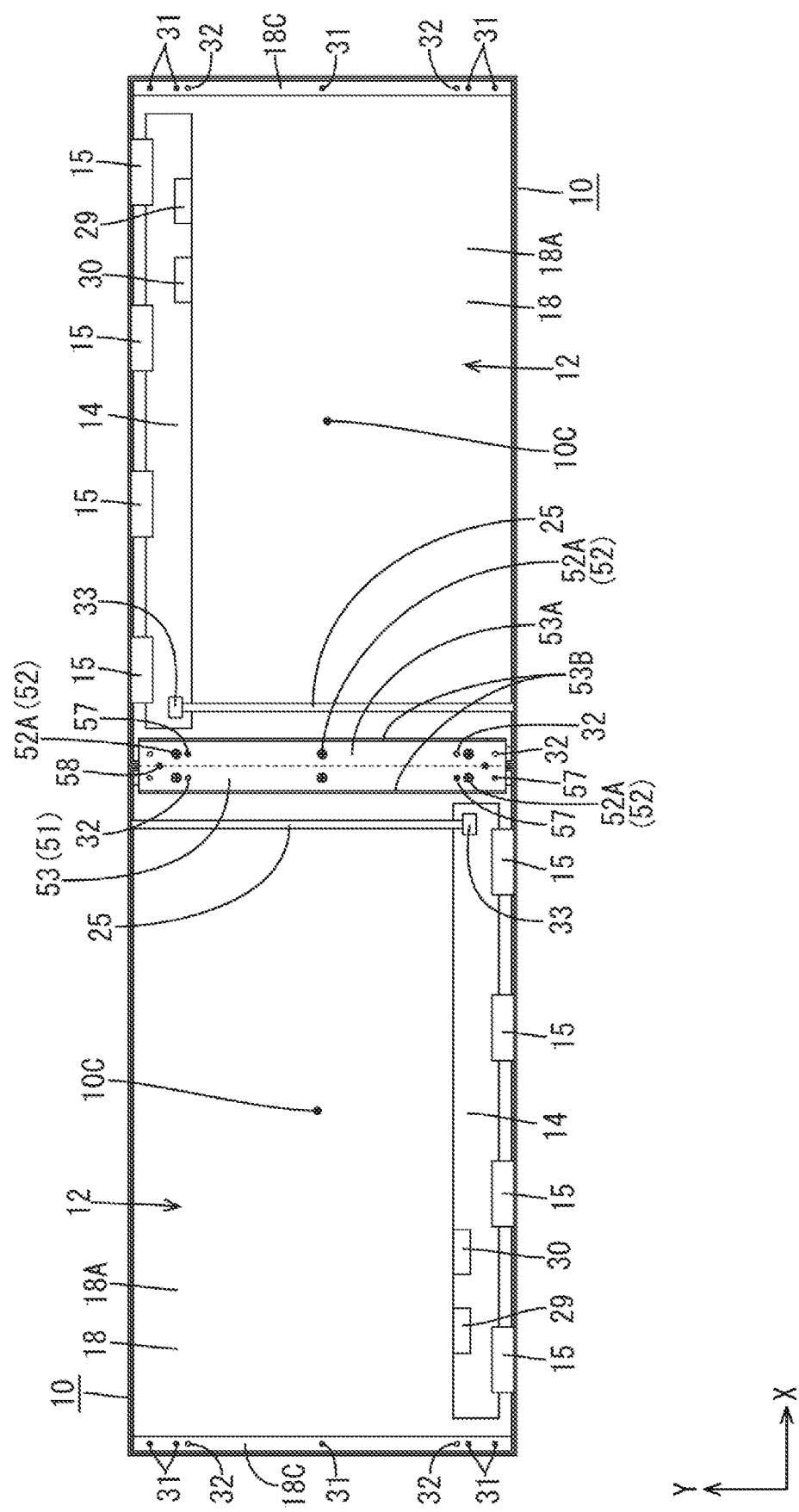
FIG. 12 is a back view of the adjacent liquid crystal display units to which the first coupling component has been attached.

The first embodiment is structured as noted above, and the following describes a method for assembling the coupled liquid crystal display device 50. First, as shown in FIG. 11, while one of the two liquid crystal display units 10 is placed in the first position and the other liquid crystal display device 10 is placed in the second position, those liquid crystal display units 10 are disposed to be adjacent to each other in the X-axis direction. In this state, the first coupling component 53 is assembled so as to overlap the two stepped sections 18C adjacent to each other. At this point of time, the coupling component side positioners 57 of the first coupling component 53 are fitted onto the liquid crystal display unit side positioners 32 of each of the liquid crystal display units 10 by means of depressions and projections so that, as shown in FIG. 12, the first coupling component 53 is positioned with respect to each of the liquid crystal display units 10 in the X-axis and Y-axis direction (see FIG. 8). In this state, each of the first fixer communication holes 55 of the first coupling component 52 communicates with a corresponding one of the fixers 31 of each of the liquid crystal display units 10. Therefore, each of the non-overlap retaining components 52A is fixed to a corresponding one of the fixers 31 while being inserted in a corresponding one of the first fixer communication holes 55. As a result, the first coupling component 53 is retained while coupling each of the liquid crystal display units 10 to the other.

Next, the pair of second coupling components 54 are each assembled to each of the liquid crystal display units 10 and the first coupling component 53. At this point of time, the second coupling component side positioners 59 of the second coupling components 54 are fitted onto the first coupling component side positioners 58 of the first coupling component 53 by means of depressions and projections so that, as shown in FIG. 6, the second coupling components 54 are positioned with respect to the first coupling component 53 and each of the liquid crystal display units 10 in the X-axis and Y-axis directions (see FIG. 8). In this state, each of the second fixer communication holes 56 of the second coupling components 54 communicates with a corresponding one of the first fixer communication holes 55 of the first coupling component 53 and a corresponding one of the fixers 31 of each of the liquid crystal display units 10. Accordingly, each of the non-overlap coupling components 52A and each of the overlap retaining components 52B are fixed to corresponding ones, respectively, of the fixers 31 while being inserted in corresponding ones, respectively, of the second fixer communication holes 56. As a result, the second coupling components 54 are retained while coupling each of the liquid crystal display units 10 to the other together with the first coupling component 53. At this point of time, each of the overlap retaining components 52B retains the first coupling component 53 and the second coupling components 54 together against each of the liquid crystal display units 10. Therefore, the number of assembling steps, the number of components, and the like are suitably made smaller than if all retaining components are non-overlap retaining components 52A.

As described above, a coupled liquid crystal display device (coupled display device) 50 according to the first embodiment includes: multiple liquid crystal display units (display units) 10 arranged adjacent to each other and each provided with multiple fixers 31; a coupling component 51, laid astride the liquid crystal display units 10 adjacent to each other, that couples together the liquid crystal display units 10 adjacent to each other; and multiple retaining components 52 that, by being fixed to the fixers 31, retain the liquid crystal display units 10 adjacent to each other and the coupling component 51. In the coupled liquid crystal display device 50, the multiple fixers 31 are placed in a point symmetrical fashion whose point of symmetry is a center 10C of a corresponding one of the liquid crystal display units 10.

This causes images to be displayed on the multiple liquid crystal display units 10 adjacent to each other, respectively, and therefore enables a display that is larger in screen size than a display on a single liquid crystal display device 10. Since the multiple retaining components 52 are fixed to the multiple fixers 31 of each of the liquid crystal display units 10 adjacent to each other, the liquid crystal display units 10 adjacent to each other and the coupling component 51 laid astride the liquid crystal display units 10 adjacent to each other are retained. For example, in a case of replacing a component of one of the liquid crystal display units 10 with a new one, it is only necessary to remove the retaining components 52 to end the connection between the liquid crystal display units 10 coupled to each other through the coupling component 51. This leads to superior convenience. Moreover, since the multiple fixers 31 are placed in a point symmetrical fashion whose point of symmetry is the center 10C of a corresponding one of the liquid crystal display units 10, the coupling component 51 can be retained by fixing each of the retaining components 52 to a corresponding one of the fixers 31 of the liquid crystal display units 10 adjacent to each other, for example, even when one of the liquid crystal display units 10 adjacent to each other is reversed with respect to the other. This makes it possible to achieve commonality of the chassis 18, which are components of the adjacent liquid crystal display units 10 in which at least the fixers 31 are provided, so that a reduction in cost can be suitably achieved. Further, as compared with the conventional need for the fixing panels that are fixed to the back surfaces of the displays and the ladder-structured mount to which the fixing panels are attached, the first embodiment makes it possible to reduce the number of components and achieve a drastic reduction in weight.

Further, the liquid crystal display units 10 adjacent to each other and the coupling component 51 are provided with liquid crystal display unit side positioners (display unit side positioners) 32 and coupling component side positioners 57, respectively, that are fitted together by means of depressions and projections, and the liquid crystal display unit side positioners 32 include multiple liquid crystal display unit side positioners 32 placed in a point symmetrical fashion about the point of symmetry (center 10C). This makes it possible to achieve mutual positioning by fitting together the liquid crystal display unit side positioners 32 and the coupling component side positioners 57 by means of depressions and projections in coupling the adjacent liquid crystal display units 10 to each other through the coupling component 51, thus leading to superior assembly workability. Moreover, since the liquid crystal display unit side positioners 32 are placed in a point symmetrical fashion about the point of symmetry (center 10C), the coupling component side positioners 57 can be fitted into the liquid crystal display unit side positioners 32 of the adjacent liquid crystal display units 10 by means of depressions and projections when one of the liquid crystal display units 10 adjacent to each other is reversed with respect to the other. This makes it possible to achieve commonality of the chassis 18, which are components of the adjacent liquid crystal display units 10 in which at least the liquid crystal display unit side positioners 32 are provided, so that a reduction in cost can be suitably achieved. As compared with a conventional case of cumbersomeness of work due to the formation of positioning depressions and projections by different ways of fitting positioning members to attaching portions formed by hollowing the outer peripheral surfaces of displays, the first embodiment makes it unnecessary to hollow the outer peripheral surfaces of the liquid crystal display units 10, eliminates the need for intricately-shaped positioning members, and achieves good assembly workability.

Further, the fixers 31 and the liquid crystal display unit side positioners 32 are provided in the chassis 18, which is the same component of each of the liquid crystal display units 10. This increases the accuracy of position of the fixers 31 and the liquid crystal display unit side positioners 32 that provided in the chassis 18, which is the same component of each of the liquid crystal display units 10. Therefore, the retaining components 52 can be smoothly fixed to the fixers 31 when the liquid crystal display units 10 adjacent to each other and the coupling component 51 are positioned by the liquid crystal display unit side positioners 32 and the coupling component side positioners 57.

Further, the coupling component 51 includes at least one of a first coupling component 53 that extends along a direction perpendicular to the arrangement direction in which the liquid crystal display units 10 are arranged and a second coupling component 54 that extends along the arrangement direction. The first coupling component 53, which extends along the direction perpendicular to the arrangement direction, makes it possible to more firmly couple together boundary portions of the liquid crystal display units 10 adjacent to each other. The second coupling component 54, which extends along the arrangement direction, makes it possible to couple together the liquid crystal display units 10 adjacent to each other while reinforcing the liquid crystal display units 10.

Further, the coupling component 51 includes the first coupling component 53 and the second coupling component 54. This makes it possible to keep the adjacent liquid crystal display units 10 coupled to each other through the first coupling component 53 and the second coupling component 54, thus making it possible to reinforce the liquid crystal display units 10 while keeping them firmly coupled to each other.

Further, the first coupling component 53 and the second coupling component 54 are disposed to partially overlap each other, and the retaining components 52 include at least an overlap retaining component 52B that retains overlap sections (namely an overlap section 53A1 and a first overhanging section 54A1) of the first coupling component 53 and the second coupling component 54 and the liquid crystal display units 10. With this, the number of retaining components 52 that are provided can be reduced by retaining the overlap sections (namely the overlap section 53A1 and the first overhanging section 54A1) of the first coupling component 53 and the second coupling component 54 against the liquid crystal display units 10 through the overlap retaining component 52B.

Further, the first coupling component 53 and the second coupling component 54 are disposed to partially overlap each other, and the retaining components 52 include at least a non-overlap retaining component 52A that retains non-overlap sections of the first coupling component 53 and the second coupling component 54 and the display units 10. This makes it possible to individually retain the first coupling component 53 and the second coupling component 54 against the liquid crystal display units 10 through the non-overlap retaining component 52A.

Further, the first coupling component 53 and the second coupling component 54 are provided with a first coupling component side positioner 58 and a second coupling component side positioner 59, respectively, that are fitted together by means of a depression and a projection. This makes it possible to, in coupling the adjacent liquid crystal display units 10 to each other through the first coupling component 53 and the second coupling component 54, position the first coupling component 53 and the second coupling component 54 with respect to each other by fitting together the first coupling component side positioner 58 and the second coupling component side positioner 59 by means of a depression and a projection, thus leading to superior assembly workability.

Further, the coupling component 51 includes at least the second coupling component 54, and the second coupling component 54 is disposed to overlap both ends of each of the liquid crystal display units 10 in the arrangement direction. This makes it possible to more firmly reinforce the liquid crystal display units 10 with the second coupling component 54 overlapping both ends of each of the liquid crystal display units 10 in the arrangement direction.

Further, the coupling component 51 includes at least the second coupling component 54, and the second coupling component 54 includes a pair of second coupling components 54 placed in locations away from each other in the direction perpendicular to the arrangement direction. This makes it possible to more stably couple the liquid crystal display units 10 adjacent to each other in the arrangement direction with the pair of second coupling components 54 placed in locations away from each other in the direction perpendicular to the arrangement direction.

Further, the pair of second coupling components 54 are identical to each other. This makes it possible to make the cost of manufacturing the second coupling components 54 lower in comparison to a configuration including second coupling components that are different from each other.

Further, the liquid crystal display units 10 adjacent to each other are identical to each other. This makes it possible to make the cost of manufacturing the liquid crystal display units 10 lower than if liquid crystal display units adjacent to each other are different from each other.

Second Embodiment

Figure 13:
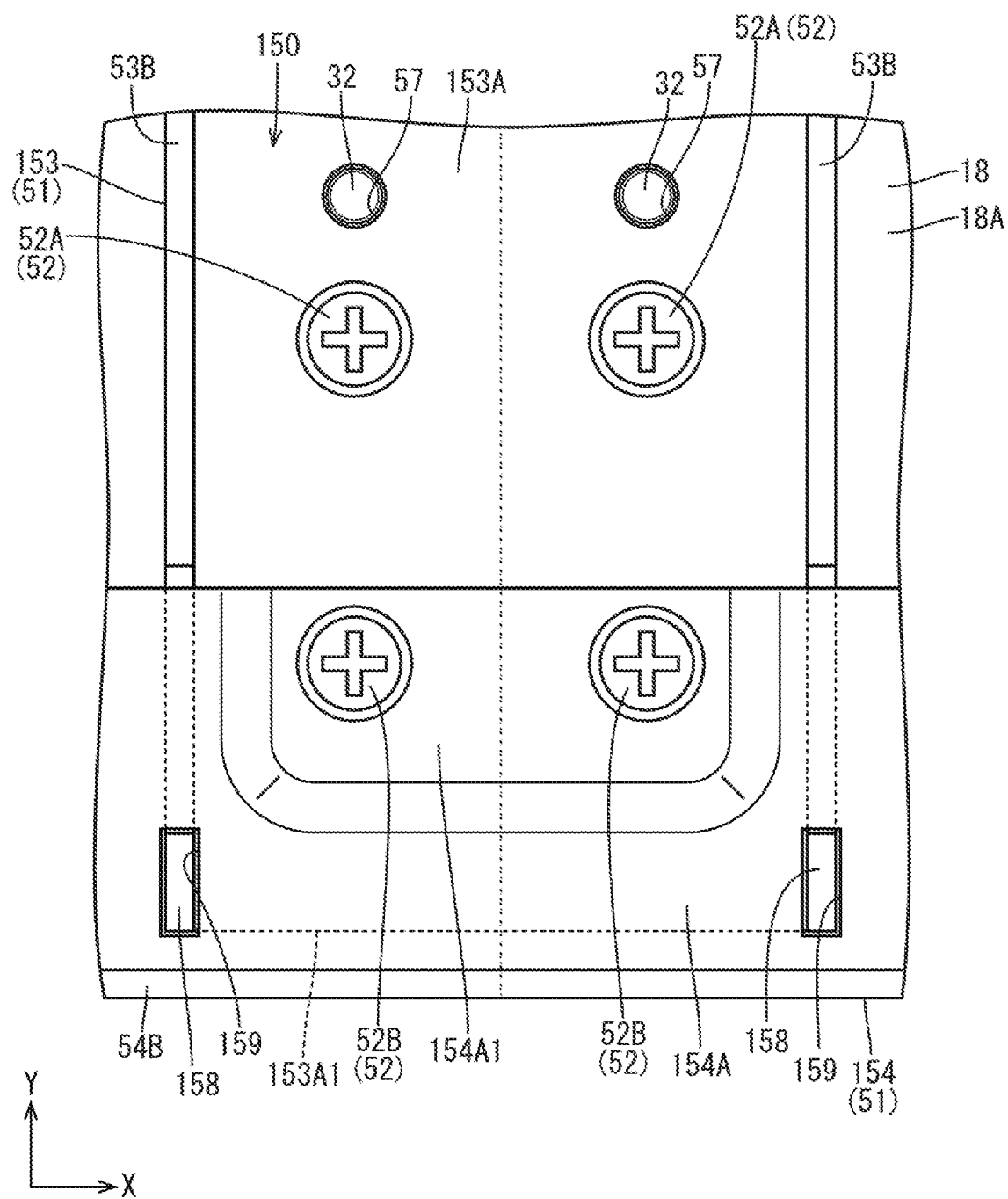
FIG. 13 is an enlarged back view of a central part and an area therearound of a coupled liquid crystal display device according to a second embodiment.

A second embodiment is described with reference to FIG. 13. The second embodiment illustrates changes made to achieve a structure for positioning of a first coupling component 153 and second coupling components 154. It should be noted that a repeated description of structures, actions, and effects which are similar to those of the first embodiment is omitted.

The structure for positioning of the first coupling components 153 and the second coupling components 154 includes first coupling component side positioners 158 and second coupling component side positioners 159. As shown in FIG. 12, each of the second coupling components 154 is provided with two of these first coupling component side positioners 158 and two of these second coupling component side positioners 159. Specifically, the first coupling component side positioners 158 are provided on a first overhanging section 154A1 of a basal part 154A of the second coupling component 154 so as to be located close to an end of a coupled liquid crystal display device 150 in the Y-axis direction. A pair of the first coupling component side positioners 158 are provided on each overlap section 153A1 of a basal part 153A of the first coupling component 153 in such a manner as to project from both ends, respectively, of the overlap section 153A in a width direction toward the back side, and take the shape of vertically long bosses. The second coupling component side positioners 159 are bored through the basal part 154A of the second coupling component 154 so as to be located in locations overlapped with the pair of first coupling component side positioners 158, and take the shape of vertically long slits. Such a configuration too makes it possible to position the first coupling component side positioners 153 and the second coupling component side positioners 154 in a manner similar to the first embodiment.

Other Embodiments

The technology described herein is not limited to the embodiments described above with reference to the drawings. The following embodiments may be included in the technical scope.

(1) It is possible to omit either the first coupling component or the second coupling component.

(2) One or not less than three second coupling components may be used.

(3) Multiple first coupling components may be used. This encompasses the case of a first coupling component divided into multiple first coupling components in the short side direction of the coupled liquid crystal display device.

(4) It is possible to appropriately change the placement of the second coupling component in the coupled liquid crystal display device in the short side direction.

(5) It is possible to use bolts or rivets as the retaining components.

(6) It is possible to appropriately change the specific number of retaining components and fixers that are provided, the specific planar arrangement of the retaining components and the fixers, and the like. Further, it is also possible to appropriately change the number of overlap retaining components and non-overlap retaining components that are included in the retaining components. Further, it is also possible to omit either the overlap retaining components or the non-overlap retaining components.

(7) The fixers and the liquid crystal display unit side positioners may be provided in different constituent components of each of the liquid crystal display units.

(8) It is of course possible to reverse the projections-and-depressions relationship between the liquid crystal display unit side positioners and the coupling component side positioners. Further, it is also possible to appropriately change the specific numbers of liquid crystal display unit side positioners and coupling component side positioners that are provided.

(9) It is possible to provide a positioning structure for positioning the second coupling components with respect to the liquid crystal display units. Further, it is also possible to omit a structure for positioning of the coupling component with respect to the liquid crystal display units.

(10) It is of course possible to reverse the projections-and-depressions relationship between the first coupling component side positioners and the second coupling component side positioners. Further, it is also possible to appropriately change the specific numbers of first coupling component side positioners and second coupling component side positioners that are provided.

(11) All constituent components of each of the two liquid crystal display units need not to be identical to those of the other liquid crystal display device. For example, since commonality of major components (such as liquid crystal panels, optical members, chassis, light-guiding plates, reflecting sheets, and detachable LED units) brings about a sufficient cost reduction effect, peripheral components of each of the two liquid crystal display units other the major components may be different from (non-identical to) those of the other liquid crystal display device. Besides those constituent components named above, which constituent components of the two liquid crystal display units are commonalized is subject to change as appropriate.

(12) The coupled liquid crystal display device may include an arrangement of three or more liquid crystal display units.

(13) The technology described herein is also applicable to a liquid crystal display device including no bezel. For example, in a case where a liquid crystal display device includes a cover glass (protective panel) for protecting a liquid crystal panel and the glass cover is configured to have a light-blocking unit having a frame shape that surrounds a display unit, the light-blocking unit constitutes a frame unit.

(14) It is possible to adopt a configuration in the LED substrate is detachable from the chassis. In that case, it is preferable that the chassis, the bezel, and the like have attaching and detaching slots bored through side surfaces thereof so as to permit attaching and detaching of the LED substrate.

(15) The term "square" encompasses a case where the liquid crystal display device and the liquid crystal panel have any rounded corners.

(16) The light-guiding plate may have one light entrance end face opposed to multiple LED substrates.

(17) It is possible to use a two-side light entrance backlight device. Furthermore, it is also possible to place the LEDs and the LED substrates so that three of the outer peripheral end faces of the light-guiding plate serve as light entrance end faces or place the LEDs and the LED substrate so that all of the outer peripheral end faces of the light-guiding plate serve as light entrance end faces.

(18) The number of panel flexible substrates that are provided, the placement of the panel flexible substrates, and the like are subject to change as appropriate. Further, the backlight flexible flat cable described in each of the embodiments described above may be replaced by a backlight flexible substrate.

(19) The control substrate may be provided with a single input connector to which a video signal and a backlight signal are supplied.

(20) The specific number, type, order of stacking, and the like of optical sheets that are used in the backlight device are subject to change as appropriate.

(21) It is possible to use a side-emitting LED as the light source. Alternatively, it is possible to use a non-LED light source (such as organic EL).

(22) A specific uses of the coupled liquid crystal display device are subject to change as appropriate.

(23) The technology described herein is also applicable to other types of display panel (such as a MEMS (Micro Electro Mechanical Systems) display panel).

The invention claimed is:

1. A coupled display device comprising:
 a first display and a second display arranged adjacent to each other and each including a plurality of fixers, the first display and the second display each having a rectangular shape and including first edges and second edges perpendicular to the first edges, one of the first edges of the first display and one of the first edges of the second display are adjacent and opposed to each other, and one of the second edges of the first display and one of the second edges of the second display are aligned with each other;
 a first coupling component having an elongated rectangular shape extending along the one of the first edges of the first display and the one of the first edges of the second display that are opposed to each other;
 at least one second coupling component having an elongated rectangular shape extending along the one of the second edges of the first display and the one of the second edges of the second display that are aligned with each other, the at least one second coupling component being fixed to the one of the second edges of the first display and the one of the second edges of the second display that are aligned with each; and
 a plurality of retaining components fixed to the plurality of fixers of the first display and the second display, the first coupling component, and the at least one second coupling component,
 wherein the plurality of fixers of each of the first display and the second display are located at positions that are point symmetric to each other with a point of symmetry at a center of each one of the first display and the second display.

2. The coupled display device according to claim 1, wherein
 each of the first display and the second display includes display side positioners at positions point symmetric to each other about the point of symmetry, respectively,
 the first coupling component and the at least one second coupling component include coupling component side positioners opposed to the display side positioners, respectively, and,
 the display side positioners and the coupling component side positioners are fitted together, respectively.

3. The coupled display device according to claim 2, wherein each of the first display and the second display includes a component including the plurality of fixers and the display side positioners.

4. The coupled display device according to claim 1, wherein
 the at least one second coupling component includes an overhanging portion including a section projecting from an inner long edge of the at least one second coupling component to overlap the first coupling component,
 the first coupling component includes an overlap section over which the overhanging portion of the at least one second coupling component is provided, and
 the plurality of retaining components include overlap retaining components that retain the overhanging portion of the at least one second coupling component to the overlap section of the first coupling component and the overlap section of the first coupling component to the first display and the second display.

5. The coupled display device according to claim 1, wherein
the at least one second coupling component includes an overhanging portion including a section projecting from an inner long edge of the at least one second coupling component to overlap the first coupling component,
the first coupling component includes an overlap section over which the overlapping portion of the at least one second coupling component is provided and a non-overlap section over which the overhanging portion of the second component is not provided, and
the retaining components include non-overlap retaining components that retain the overhanging portion of the at least one second coupling component to the non-overlap section of the first coupling component and the non-overlap section of the first coupling component and the first display and the second display, respectively.

6. The coupled display device according to claim 5, wherein
the at least one second coupling component includes a second coupling component side positioner in the section projecting from the inner long edge of the at least one second coupling component,
the first coupling component includes a first coupling component side positioner opposed to the second coupling component side positioner, and
the first coupling component side positioner and the second coupling component side positioner are fitted together.

7. The coupled display device according to claim 4, wherein
the overhanging portion is a first overhanging portion, and
the at least one second coupling component further includes second overhanging portions that overlap the first edges of the first display and the second display spaced away from each other, respectively.

8. The coupled display device according to claim 4, wherein
the at least one second coupling component includes second coupling components spaced away from each other in a direction in which the first coupling component extends.

9. The coupled display device according to claim 1, wherein the first display and the second display have a same configuration.

10. The coupled display device according to claim 1, wherein
the first display and the second display each include a chassis, respectively,
the plurality of fixers are provided in the respective chassis of the first display and the second display, and
the first coupling component and the second coupling component are fixed to the chassis respective of the first display and the second display.

11. The coupled display device according to claim 8, wherein
the first display and the second display each include a chassis,
the plurality of fixers are provided in the chassis of the first display and the second display, respectively,
the first coupling component includes another overlap portion spaced away from the overlap portion in the direction in which the first coupling component extends,
the overhanging portion of one of the second coupling components is positioned over the overlap portion of the first coupling component, and
the overhanging portion of another one of the second coupling components is positioned over the other overlap portion of the first coupling component.

12. The coupled display device according to claim 11, wherein
the overlap portion of the first coupling component is between the overhanging portion of one of the second coupling components and the chassis of the first display and the second display, respectively, and
the other overlap portion of the first coupling component is between the overhanging portion of the other one of the second coupling components and the chassis of the first display and the second display, respectively.

13. A coupled display device comprising:
a first display and a second display adjacent to each other and each including a plurality of fixers, the first display and the second display having a rectangular shape and including first edges and second edges perpendicular to the first edges, one of the first edges of the first display and one of the first edges of the second display are adjacent and opposed to each other, and one of the second edges of the first display and one of the second edges of the second display are aligned with each other;
a first coupling component having an elongated rectangular shape extending along the first edges of the first display and the second display opposed to each other, the first coupling component being fixed to the respective first edges of the first display and the second display opposed to each other;
at least one second coupling component having an elongated rectangular shape extending along the respective second edges of the first display and the second display aligned with each other, the at least one second coupling component being fixed to the respective second edges of the first display and the second display aligned with each other; and
a plurality of retaining components fixed to the fixers of the first display and the second display, the first coupling component, and the at least one second coupling component, wherein
the plurality of fixers of each of the first display and the second display are located at positions point symmetric to each other with a point of symmetry at a center of each one of the first display and the second display, respectively,
the first display includes a first display panel, a first backlight behind the first display panel, and a first bezel holding the first display panel and the first backlight together,
the first backlight has a rectangular shape,
the first backlight includes a first chassis having a rectangular frame shape and holding other components of the first backlight,
the second display includes a second display panel, a second backlight behind the second display panel, and a second bezel holding the second display panel and the second backlight together,
the second backlight has a rectangular shape,
the second backlight includes a second chassis having a rectangular frame shape and holding other components of the second backlight,
the plurality of fixers are provided in the first chassis and the second chassis, and the first coupling component and the second coupling component are fixed to the first chassis and the second chassis.

\* \* \* \* \*